(12) United States Patent
Fousse

(10) Patent No.: US 6,723,943 B2
(45) Date of Patent: Apr. 20, 2004

(54) MANUFACTURING METALLIC STRIP FOR PACKAGING HAVING A COATING MADE UP OF A METALLIC LAYER AND A POLYMER FILM, AND THE STRIP OBTAINED

(75) Inventor: Daniel Fousse, Plappeville (FR)

(73) Assignee: USINOR, Puteaux (FR)

( * ) Notice: Subject to any disclaimer, the term of this patent is extended or adjusted under 35 U.S.C. 154(b) by 146 days.

(21) Appl. No.: 10/022,394

(22) Filed: Dec. 20, 2001

(65) Prior Publication Data
US 2002/0079050 A1 Jun. 27, 2002

(30) Foreign Application Priority Data
Dec. 27, 2000 (FR) .............................. 00 17086

(51) Int. Cl.⁷ .............................................. B23K 1/002
(52) U.S. Cl. .................. 219/85.22; 219/78.01
(58) Field of Search .................. 219/85.22, 78.01, 219/85.1

(56) References Cited

U.S. PATENT DOCUMENTS

| 3,988,175 A | * | 10/1976 | Baker et al. | .................. | 148/26 |
| 5,667,849 A | * | 9/1997 | Carey et al. | ................. | 427/431 |
| 6,372,997 B1 | * | 4/2002 | Hill et al. | ................... | 174/252 |

FOREIGN PATENT DOCUMENTS

| EP | 0-415-345 | 3/1991 |
| EP | 415345 A2 * | 3/1991 | ........... B32B/15/08 |
| EP | 0-919-593 | 6/1999 |
| FR | 2-530-529 | 1/1984 |
| FR | 2-571-659 | 4/1986 |
| FR | 2-692-835 | 12/1993 |

* cited by examiner

Primary Examiner—M. Alexandra Elve
(74) Attorney, Agent, or Firm—Sughrue Mion, PLLC

(57) ABSTRACT

Process for manufacturing metallic strip for packaging comprising strip steel covered on at least one of its faces with a coating containing a sub-layer of tin and an external film of polymer, according to which:

Figure 1:
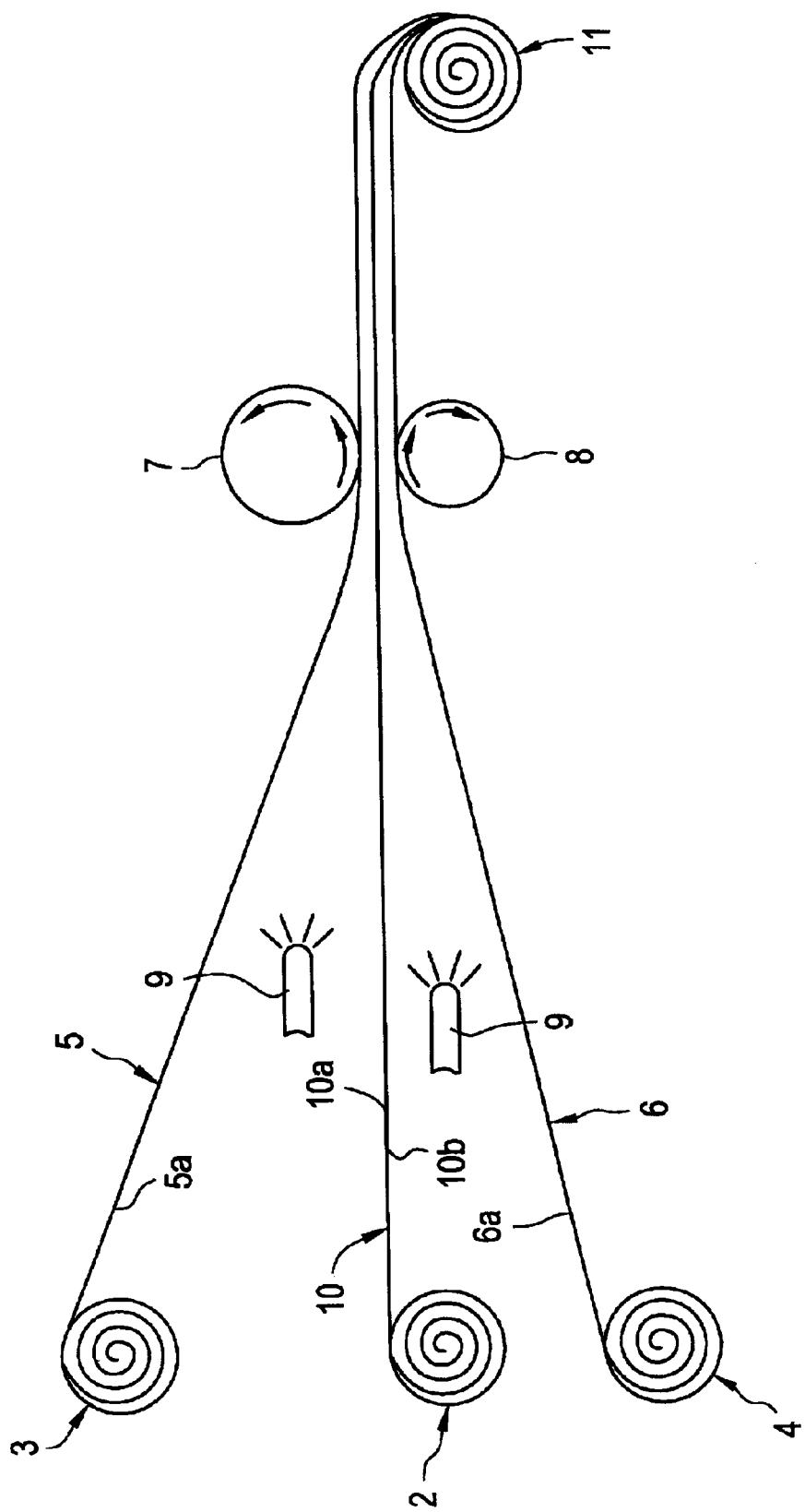

on one hand, a layer of tin is deposited on at least one of the faces of the steel strip;

and on the other, a layer of tin is vacuum-deposited on one face of at least one polymer film;

then at least one polymer film covered with tin and the steel strip having at least one layer of tin are brought together in such a way that the face of at least one film of polymer covered with tin or tin base alloy will be across from one face of the steel strip having a layer of tin and injecting a flux between the said faces to clean the surfaces covered with tin; and at least one polymer film is welded on the face of the steel strip.

18 Claims, 2 Drawing Sheets

MANUFACTURING METALLIC STRIP FOR PACKAGING HAVING A COATING MADE UP OF A METALLIC LAYER AND A POLYMER FILM, AND THE STRIP OBTAINED

The present invention relates to a continuous manufacturing process for metallic strips, such as steel strips, in which at least one face is covered with a sub-layer of tin and an upper layer of organic coating.

The invention applies particularly to the manufacturing of steel strips for packaging such as food cans and beverage cans.

In one of the known manufacturing procedures for this type of strips of steel, the steel is tin plated electrolytically, then coated with an organic coating by coating with a lacquer either using a brush or a roller.

After coating, the lacquer, which is essentially composed of a duroplastic polymer and an organic solvent, undergoes curing to initiate or complete the polymerizing and to create the tin-polymer bonds that make it possible for the lacquer to adhere to the tin-plated steel. The difficulty lies in control of the curing temperature. In fact, in the case of undercuring of the lacquer, adequate tin-polymer bonds are not formed or they may even remain capable of being hydrolyzed (presence of hydrogen bonds) and there is a risk of the appearance of separation at the time that the cans manufactured with this type of coated steel are sterilized. In summary, in the case of undercuring, a loss of adhesion of the lacquer on the tin-plated steel is observed and/or a discoloration (browning) of the lacquer.

In addition to having to strictly control the curing of the lacquer, this procedure has other disadvantages, mentioned below:

it is absolutely necessary to apply the lacquer coating in a thin layer in order to facilitate total elimination of the organic solvent, of the water and more generally of the different volatile products of polymerization; this makes it necessary to have successive lacquer coatings on the tin-plated steel strip with an adequately slow speed on the order of 100 m/min. for production line lacquering, and 20 m/min. for sheet lacquering to obtain a lacquer layer with satisfactory thickness; generally, the coating proceeds with two to four layers of lacquer to obtain a final layer with a thickness on the order of 8 to 25 $\mu$m;

successive application of several lacquer layers requires undercuring of the first layers to avoid their overcuring at the time of thermoprocessing of later layers, which has a negative effect on the adhesion of the coating and its visual appearance; this considerably complicates controlling the adhesion of the lacquer on the substrate;

currently, environmental regulations impose standards that are more and more restrictive in view of reducing the use of organic solvents (VOC), and even eliminating them, which means that industries have to try to find replacement solutions;

the cost of the lacquers is very high and their usage is limited in time because of the storage problems that they present; in fact, at the time of storage, there is the risk of observing a partial or total polymerization in the can, which makes the lacquer useless;

the cost of construction for a tin-plating line is very high.

In another procedure, the steel that is previously degreased, pickled and dried is tin plated with an electrolytic deposit of tin, then coated with a thermoplastic film by bonding the film on the tin layer with an adhesive.

This procedure also involves disadvantages. In fact, the adhesion of the polymer on the steel or on the tinned sheet (steel coated with tin or even tin-plated steel) is not instantaneous. Thus, this is fairly difficult to obtain in a fraction of a second of contact, even if the polymer is melted and hot. In addition, management of a melted layer is a problem that has not yet been resolved for polymers of the polyethylene terephthalate type, PET. Besides that, the adhesion, which itself is fairly difficult, requires the elimination of solvents from the adhesive through the polymer film, which is not easy. It should be noted, in addition, that the presence of the adhesive between the steel and the polymer film can easily be detected by the infrared technique.

Thus the goal of the present invention is to propose a procedure for continuous manufacturing, at high speed, of strip steel of which at least one face is coated with a sub-layer of tin and an upper layer of an organic coating having good adhesion to the substrate, which makes it possible to better control the thickness of the organic coating by application of a polymer layer, all at once, that is possibly very thick and to avoid use of organic solvents or adhesives.

For this purpose, the object of the invention is a process for manufacturing coated metallic strip for packaging made up of a thin metallic strip coated on at least one of its faces with a coating having, in order starting from the surface of the thin metallic strip, a layer of tin or tin base alloy, possibly an intermediate metallic layer and an organic layer formed of a polymer film, according to which:

on one hand, on at least one of the faces of the thin metallic strip carrying out tin dip coating or tin plating places a layer of tin or tin base alloy;

on the other hand, on one face of at least one film of polymer, at least one metallic layer is vacuum deposited in such a way as to obtain a polymer film coated on one face with an external layer of tin or tin base alloy;

then at least one film of coated polymer and the thin metallic strip having at least one layer of tin or tin base alloy are brought together in such a way that the face of the at least one film of polymer covered with tin or tin base alloy is across from one face of the thin metallic strip having a layer of tin or tin base alloy, by injecting between the two faces a flux to clean the surfaces covered with a layer of tin or tin base alloy; and at least one polymer film is welded to the face of the metallic strip.

The procedure according to the invention may comprise one or several of the following characteristics:

the thin metallic strip is of steel;

at least one polymer film is coated on one of its faces, first with an intermediate layer of aluminum or aluminum base alloy, then a layer of tin or tin base alloy;

the at least one film of polymer is welded on the thin metallic strip using hot rolling at a temperature between the melting temperature of the tin or tin base alloy and the melting temperature of the polymer;

to carry out the hot rolling, the thin metallic strip is heated by induction or conduction;

the basis weight of the layer of tin on the steel strip after tin plating or tin coating is between 0.05 and 1 g/m$^2$, preferably between 0.1 and 0.2 g/m$^2$;

the polymer film is a thermoplastic polymer film preferably chosen from among PET, PAN or PTFE, of which the thickness is between 5 and 10 $\mu$m, preferably between 10 and 20 $\mu$m;

the vacuum depositing of the tin or tin base alloy layer on the polymer film is carried out using PVD, and the thickness of this layer of tin or tin base alloy is between 0.01 and 1 μm, preferably between 0.05 and 0.2 μm;

the flux is carried out using an alcohol-rosin dispersion, phenolsulfonic acid or chlorhydric acid, simultaneously on the tin or tin base alloy covering the steel strip and on the tin or tin base alloy covering the polymer film.

Finally, one goal of the invention is coated metallic strip for packaging making up strip steel covered on at least one of its faces with a coating comprising, in the order starting from the surface of the steel strip, a layer of tin or tin base alloy, possibly an intermediate aluminum or aluminum base layer, and a film of thermoplastic polymer without a trace of adhesive between the layer of tin or tin base alloy and the thermoplastic polymer film.

As would be understood, the invention consists of welding the tin on itself to avoid the problems of undercuring or overcuring inherent with duroplastic polymers making up the lacquer and avoiding the use of adhesive.

This procedure can be applied to any polymers, under the condition that their melting point is greater than the melting temperature of tin (232 C.) or of the tin base alloy, depending on the case.

Figure 2:
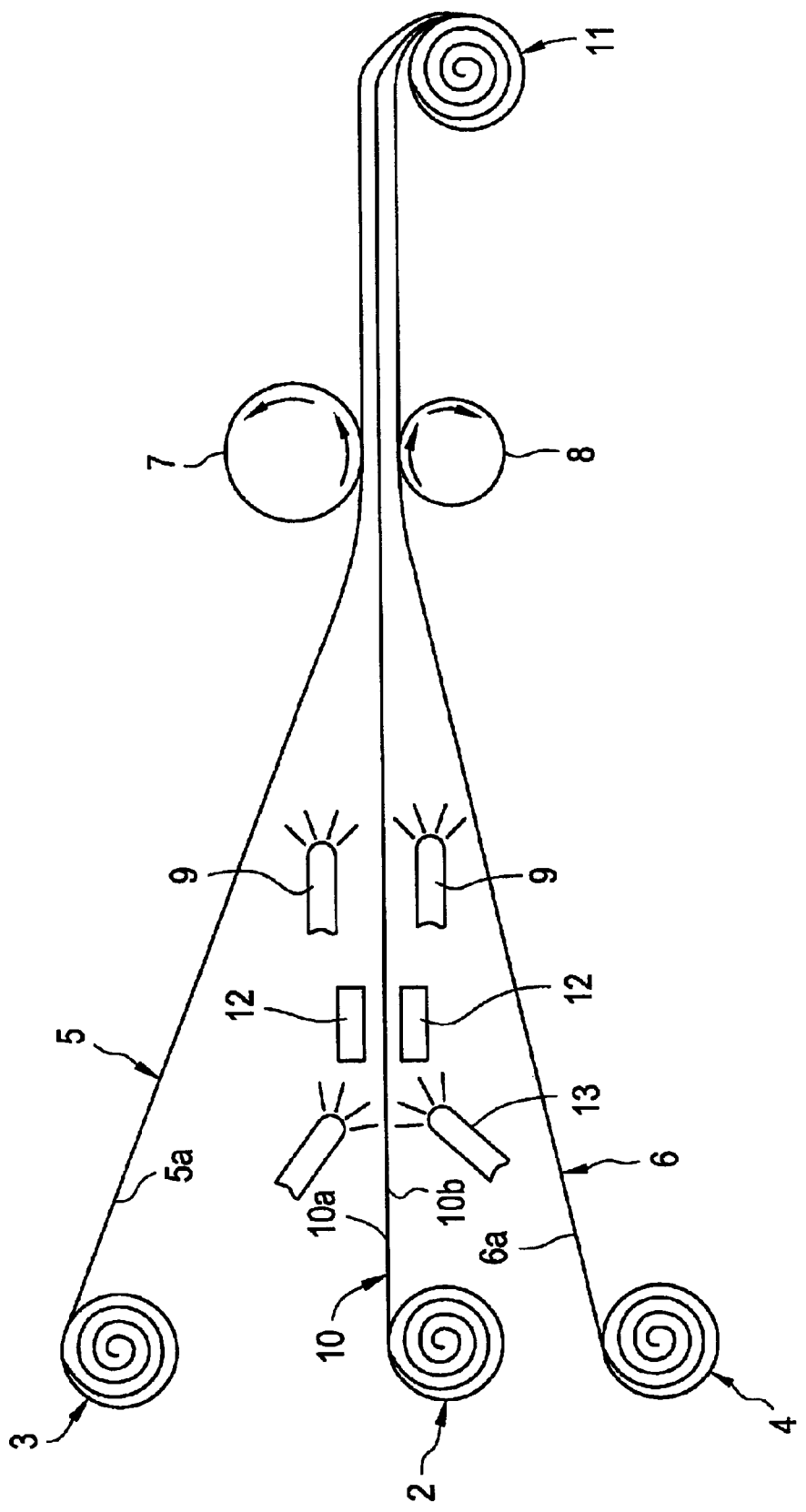

The invention will be better understood by reading the description that follows, given as a non-limiting example, and with reference to FIG. 1 attached, which is a schematic front view of a part of a manufacturing facility for metallic strip for packaging using heat rolling, as well as FIG. 2, which also represents a part of a manufacturing facility for metallic strip for packaging, using hot rolling with prior heating of the strip by conduction or by induction.

The packaging industry is a large consumer of sheet metal and of metal strip coated with tin on at least one of its faces, protected by a film of an organic compound deposited either by coating or by adhesion of an organic film. In the case of use of this type of sheet metal in the area of foodstuffs, it is absolutely necessary to ensure that no residual toxic compound, like organic solvents, is present, even in trace form, in the organic film. Thus it is necessary to strictly control each manufacturing step of this type of sheet metal.

After having been hot rolled then cold rolled, the steel strip is degreased in a hot alkaline bath in order to eliminate from the surface any traces of oil and carbon products.

The strip thus degreased undergoes tin plating in an electrochemical plating line in a bath having an aqueous solution of at least one strong acid and a tin salt.

The bright dipping bath may also consist of a tin-plating bath diluted with a strong acid.

The bright dipping bath has two actions:

on one hand, the surface of the steel is brightened by elimination of the iron oxides formed during the preceding manufacturing steps;

on the other hand, a very thin layer of tin is deposited on the brightened surface.

Strong acids that can be used in the present invention are chosen from among: chlorhydric acid, sulfuric acid, nitric acid.

Preferably, the bright dipping baths are made up of either:

a mixture of chlorhydric acid and stannous chloride in an aqueous solution; or a mixture of sulfuric acid and tin sulfate in aqueous solution; or a tin-plating bath diluted either with sulfuric acid or with a mixture of sulfuric acid and phenolsulfonic acid.

A conventional tin-plating bath is made up of tin sulfate, sulfuric acid and additives such as antioxidants and brightness chosen from between phenolsulfonic acid (APS) or ethoxynaphthalene sulfonic acid (ENSA).

The acid is introduced into the bath in such a way that the equivalent concentration of sulfuric acid would be between 10 and 100 g/l, preferably between 15 and 25 g/l.

In fact, if the pH of the solution is too acidic (pH close to zero), there can be a risk of brightening that is too great, thus interfering with the tin deposit.

In summary, if the pH of the solution is greater than 1, the acid will not be strong enough to attack the iron oxide covering the surface of the steel; since the tin will not deposit or adhere on iron oxide, the tin deposit that is the goal will not be obtained.

Thus, the bright dipping bath contains 10 g/l to 100 g/l acid (expressed in $H_2SO_4$ equivalent since usually several acids are present in the bath), preferably from 15 g/l to 25 g/l, and from 0.1 g/l to 1 g/l of ionic tin $Sn^{2+}$, preferably from 0.3 g/l to 0.5 g/l.

Finally, the bath can contain other compounds depending on the application involved, such as surfactants or conventional additives for the tin plating solution like phenolsulfonic acid and ethoxynaphthalene sulfonic acid (ENSA).

In order to obtain a tin basis weight on the surface of the strip between 0.05 and 1 $g/m^2$ (i.e., a layer with thickness between 0.04 to 0.08 μm), preferably between 0.1 and 0.2 $g/m^2$ (i.e., a layer with thickness between 0.008 to 0.02 μm), the optimum operating conditions are as follows:

line speed: 300 to 600 m/min current density adapted to the line speed processing time: on the order of 0.5 s bath temperature: on the order of 35 C.

In a variation of the invention, the steel strip, previously pickled, can be subjected to a light tin plating under the conditions of a conventional tin plating line in such a way as to cover it with a tin layer of which the basis weight is between 0.05 and 8 $g/m^2$ (i.e., a layer with thickness between 0.04 to 0.7 μm).

The steel strip, of which the two faces have been covered with a fine tin layer, is rinsed with water by atomizing, by immersion or by any other means, dewatered then dried, e.g., in hot air for 0.5 to 2 s.

In parallel to the tin-plating operation for the steel strip, a vacuum deposit of a tin layer is carried out on the surface of at least one polymer film.

By way of example of polymers that can make up the film according to the invention, it is possible in particular to mention all of those that are able to form films, such as:

duroplastic polymers such as the epoxy-phenols or the organosols;

thermoplastic polymers such as polyethylenes (PE), polypropylenes (PP), polyesters, polyethylene terephthalate (PET), polyacrylonitrile (PAN), teflon (polytetrafluoroethylene: PTFE).

In a preferred embodiment of the invention, the polymers making up the film are thermoplastic polymers.

Preferably, the coated thermoplastic polymers are PET and PAN or PTFE. In fact, these polymers maintain the best mechanical properties at elevated temperatures, in particular at temperatures on the order of 230 C., which corresponds to the melting point of tin.

The termoplastic film is obtained by extrusion of thermoplastic polymer, or by rolling and coating of the polymer, in such a way as to obtain films of which the length may vary between 10 cm and 2 m and even more and of which the thickness is uniform and may be set as desired between 5 and 100 $\mu$m or even more, but preferably between 10 and 20 $\mu$m.

The thicker the polymer film, the more the resistance to corrosion and abrasion is improved in the body or the bottom of the can manufactured using material made according to the invention. In fact, the thicker the polymer film, the lower the permeability to liquids and to gases and the lower the porosity; protection of the foods or the liquids contained in the can is thus better ensured.

The film is then vacuum coated with a deposit of tin on one of its faces in such a way as to obtain a layer of tin with uniform thickness between 0.01 and 1 $\mu$m, preferably between 0.05 and 0.2 $\mu$m.

The vacuum deposit of tin on the polymer film can be obtained by one of the vacuum coating techniques known in and of itself such as:

PVD (Physical Vapor Deposition)
CVD (Chemical Vapor Deposition)
PECVD (Plasma Enhanced Chemical Vapor Deposition)

The coating technique using PVD is preferable since it makes it possible to obtain a metallic deposit that has good adhesion to the substrate in a quick and economical way.

The adhesion between the tin and the carbon in the polymer is immediate and direct because of the release of the latent vaporizing energy of the tin at the time of vacuum deposit; the bond between the tin and the carbon present also has the advantage of being relatively insensitive to hydrolysis.

According to a variation of the invention, it is possible to carry out a double vacuum deposit of metal on the polymer film. Thus, prior to depositing the tin layer, a deposit of an aluminum layer or aluminum base alloy layer under vacuum is carried out on the film. This layer of aluminum or aluminum base alloy has good adhesion on the polymer and the absence of aluminum oxides (work is done in a vacuum without intermediate contact with the air) and then permits adhesion of the tin on the aluminum or aluminum base alloy; as in the preceding case, the layer of tin makes it possible to weld the assembly on tin-plated steel.

The product obtained, which consists of steel that is lightly tin plated coated on at least one of its faces with a fine layer of aluminum or aluminum base alloy and an external polymer film, has better resistance to corrosion and to sulfurizing since the product does not have any intermediate layer(s) of aluminum or aluminum base alloy between the tin and the polymer film. In addition, this product has an appearance that is more brilliant.

In addition, in spite of the addition of a supplementary metallic layer, a reasonable cost is maintained.

According to a particular embodiment of the invention, it is also possible to implement a co-deposit under vacuum of tin and of another metal on the polymer film. A polymer film coated with a tin-metal alloy layer is thus obtained. The choice of metals like indium, lead, bismuth, gallium and antimony make it possible to obtain alloys with the tin, of which the melting point is considerably lower in comparison to the melting point of tin. The choice of polymers that can be used thus becomes greater: in addition to PET, PAN and PTFE, it is possible to use polymers of which the melting point is lower that 232 C. and thus to use polymers such as polyethylene or polypropylene. However, because of the type of metals previously mentioned, the presence of such tin-metal alloys does not ensure compatibility with packaging applications for food products of the strips coated by the procedure according to the invention. Thus, this type of strip is reserved for manufacturing packaging for non-food usage, e.g., for storing paint or oil.

In the current state of the art, the speeds of vacuum deposit of tin on the thermoplastic film can reach 1000 m/min.

Now we will describe the manufacturing process of steel for packaging according to the invention by referring to FIG. 1.

Before the polymer film is coated with tin on one of its faces, it is coiled to make up two coils 3, 4, as shown in FIG. 1.

In FIG. 1, a coil 2 of strip steel 10 is represented schematically, of which the two faces 10a and 10b are subject to tin-plating as mentioned above.

Thus, in this embodiment, the two faces 10a and 10b are coated with a layer of tin.

In addition, in this figure, two coils, 3 and 4 respectively, are shown each consisting of a polymer film, 5 and 6 respectively, of which one face 5a and 6a has been previously coated with a vacuum deposited tin layer.

In this installation, two rolling cylinders, 7 and 8 respectively, are also shown that are mounted on top of each other and heated to a specific temperature, as will be seen below. Cylinders 7 and 8 are kept in rotation in opposite directions.

Face 5a of the polymer film 5 on which a layer of tin was previously deposited is intended to be applied to face 10a of the steel strip 10, and face 6a of the polymer film 6 previously coated with a layer of tin is intended to be applied to the face 10b of the said steel strip 10.

To do this, coils 2, 3 and 4 are unwound simultaneously and at the same speed to apply the polymer films 5 and 6, respectively, on the faces 10a and 10b of the steel strip 10 in such a way as to introduce the composite assembly thus formed of the steel strip 10 and the two polymer films 5 and 6 between the two pressing rollers 7 and 8.

Prior to the deposit of the polymer films 5 and 6 on the faces 10a and 10b of the steel strip 10, a flux is injected between the space that occurs between the two polymer films 5 and 6 and the steel strip 10, which cleans the tin-coated surfaces. This flux acts by elimination of the tin oxides that are formed on the faces 5a and 6a coated with tin of the polymer films 5 and 6, and also on the faces 10a and 10b, coated with tin, of the steel strip 10. For this reason, an injection pipe 9 for this flux eliminating tin oxides is arranged in each space between the polymer films 5 and 6 and the steel strip 10, thus as shown in FIG. 1.

At the time of passage of the compound assembly thus formed between cylinders 7 and 8, which have been heated, the layers of tin deposited on the faces 5a and 6a of the polymer films 5 and 6 and on the faces 10a and 10b of the steel strip 10 melt, which makes it possible to obtain the welding of each polymer film 5 and 6 on the corresponding face of the steel strip 10. The welding of the tin on itself is instantaneous since the oxides have been eliminated. In addition, it is not even necessary that the two layers of tin be completely melted; in fact, the molten tin softens the tin islets and thus prevents powdery deposits.

At the output of rollers 7 and 8, the composite assembly can roll up to form a coil 11. If necessary, a water spray makes it possible to cool the surface more quickly.

According to one variation, the steel strip 10 can be coated on only one of its faces with a polymer film in the same way as that mentioned above.

As soon as the tin is in contact with the air, it oxidizes and its surface is covered with tin oxides of the type SnO and primarily $SnO_2$, which makes the welding of the tin impossible. Thus, it is necessary to treat these tin oxides by injection of a flux that eliminates them by fusion or dissolving before the passage of strips 5, 6 and 10 between the rolling cylinders 7 and 8.

As an example of fluxes that are able to eliminate tin oxides, the following, for example, can be used:
- weak acids in aqueous solution (citric acid) or in alcohol solution (alcohol-rosin or colophony);
- acids in aqueous solution conventionally used as flux for remelt of tinned sheet (tinned sheet is the common name for tin-plated steel), such as chlorhydric acid or phenolsulfonic acid;
- flux products like zinc chloride in aqueous solution.

The concentration and the flow rate of the flux are adjusted, using conventional methods, as a function of the degree of oxidation on the tin-plated surfaces.

Since the melting temperature of tin is 232 C., the thermoplastic films are chosen from among polymers of which the melting temperature is greater than this temperature (this is the case in particular with PET, which withstands a temperature of 250 C., and PAN or PTFE, which withstand 300 C.).

It may be useful to preheat the metallic strip by induction or by conduction to accelerate the increase in temperature, in particular in the case where the deposit of the tin-plated polymer film is carried out on the two faces of the tin-plated strip. In fact, thermal contact will then necessarily occur across a polymer layer, but more slowly, which may be incompatible with an increased line speed.

The temperature of the rolling cylinders is advantageously between 235 and 250 C. in order, on one hand, to ensure the fusion of the tin and to make it possible for the tin layers to adhere to each other and, on the other hand, to meet the requirements of the thermoplastic films.

The maximum rolling speed is usually between 300 and 400 m/min. and that of the tin plating may reach 300 to 600 m/min. Since the metallic strip passes in succession through the pickling vat before moving into the rolling section, this generally makes the speed mandatory. As we have already indicated, the vacuum deposit speed of tin on PET, a totally separate operation, may exceed 1,000 m/min.

According to a variation of the invention shown in FIG. 2, the installation has means 12 for heating the steel strip 10 prior to welding the polymer films 5 and 6. In the case of welding of the polymer film 5, a means 12 for heating is arranged across from the face 10a of the metallic strip 10 and in the case of welding the polymer film 6, a means 12 for heating is arranged across from the face 10b of the metallic strip 10.

When a polymer film 5 and 6 is welded on each face 10a and 10b of the metallic strip 10, a means 12 of heating is placed across from each of the faces 10a and 10b of the said metallic strip 10.

This means 12 of heating is a means of heating by induction or conduction, of which the temperature is between 235 and 250 C., and has as its goal heating the steel strip 10 to melt the fine tin layer coating the face or the two faces 10a and 10b of the said strip 10.

The film or films of polymer 5 and 6 coated with a thin tin deposit 5a and 6a on the strip 10 are welded by rolling between rollers 7 and 8. In this case, the rolling may be carried out with cylinders at ambient temperature or even at a temperature that is much less than the melting temperature of the tin. In addition, prior to the heating of the tin-plated steel strip 10, the tin oxides may advantageously be eliminated from the surface of the said strip by a flux 13.

The procedure according to the invention thus makes it possible to produce, at high speeds, steel strips coated on their two faces with a sub-layer of tin and on at least one face with an external layer of an organic coating on a compact line for metallic and organic coating. This consists, as has been seen, of installations for degreasing, tin plating, vacuum deposit and rolling, which make it possible to produce coated strips of great lengths; polymer films available up to 2 m in length, vacuum deposits carried out in furnaces or by electron jets that are unlimited in number.

When the metallic strip and the polymer film are coated with a layer of tin alloy having a melting point less than that of tin, the temperature of the rolling cylinders or they cylinders for preheating the strip are adjusted as a result.

The procedure according to the invention also presents other advantages such as:
- limitation of polluting waste: no use of glue or adhesive, no emission of volatile organic components, no management of tin plating bath; all that is required is to treat the flux residues that are expelled under pressure at the time of rolling;
- limitation of lacquering faults; in fact, extruded thermoplastic polymers form films of regular thickness, which may exceed 25 $\mu$m, and namely in a single operation; they are not sensitive to overcuring, are supple and adhere well to the tin; the only faults observed are inclusions of air bubbles when the rolling speed and/or the roughness of the steel are too high;
- the thermoplastic films do not have a limited service life;
- cost reduction: an extruded polymer mass is much less hazardous than a conventional lacquer for steel for packaging of the same thickness;
- lack of pollution at the time of incineration after use of the products made using the steel obtained according to the procedure; for example, for a PET, only release of carbonic gas and water;
- possibility of bonding PET on PET by simple heating if e.g., it is desirable to make a three-piece glued can;
- flexibility of the polymer coating that is clearly greater; this makes possible increased protection of the areas where the metal is more greatly deformed such as in the crease of the can body which is sometimes an area of significant corrosion;
- brilliance (reflectivity) of the coated steel strip according to the invention that is greater than that of lacquered tin-plated steel according to the state of the art in a case where the film of thermoplastic polymer is transparent (for example, the case of PET);
- the possibility of obtaining steel for packaging that is very thin: by using the procedure according to the invention, it is possible to coat steel strips with very fine thickness on the order of 0.10 mm while, when using the procedures according to the state of the art, at this time it is not possible to coat anything except steel strip of which the thickness is generally between 0.17 and 0.24 mm. In fact, the production of very thin tin plate is difficult on a conventional tin-plating line because the tensions to which the metal is subjected sometimes lead to breaking of the steel strip. The procedure according to the invention is carried out on much shorter lines and because of this fact; the tensions to which the strip are subjected are lower. In addition, simultaneous coating of the polymer may be carried out at speeds on the order of 300 to 400 m/min., much lower than the usual tin plating speeds. Nevertheless, the procedure according to the invention remains economical in comparison to tin plating at 400–600 m/min. followed by lacquering at 100–300 m/min.

Finally, the coated strip obtained is distinguished from the known coated strips by adhesion of a polymer film, and because of this there is no trace of adhesive that can be detected.

What is claimed is:

1. A method for manufacturing a coated metallic strip for packaging comprising a thin metallic strip coated on at least one of its faces with a coating containing, in order starting from the surface of the thin metal strip, a layer of tin or tin base alloy, optionally an intermediate metal layer, and an organic layer formed of a polymer film, comprising:

depositing a layer of tin or tin base alloy on at least one of the faces of the thin metallic strip;

vacuum-depositing a layer of tin or tin base alloy on one face of at least one polymer film;

bringing together the at least one polymer film having a layer of tin or tin base alloy and the thin metallic strip having at least one layer of tin or tin base alloy in such a way that the tin or tin base alloy face of the at least one film of polymer having a layer of tin or tin base alloy is across from one tin or tin base alloy face of the thin metallic strip having a layer of tin or tin base alloy, and injecting a flux between the said faces brought together to clean the surfaces covered with tin or tin base alloy; and welding the at least one polymer film on the face of the thin metallic strip.

2. The method according to claim 1, in which the thin metallic strip is made of steel.

3. The method according to claim 1, in which the at least one polymer film is coated on one of its faces, first with an intermediate layer of aluminum or aluminum base alloy, then with the layer of tin or tin base alloy.

4. The method according to claim 1, in which the at least one film of polymer is welded on the thin metallic strip by using hot rolling at a temperature between the melting temperature of tin or tin base alloy and the melting temperature of the polymer.

5. The method according to claim 4, in which in order to carry out the hot rolling, the thin metallic strip is heated by induction or conduction.

6. The method according to claim 1, wherein tin or tin base alloy is deposited by bright dipping or tin plating and the basis weight of the tin layer on the steel strip after bright dipping or tin plating is between 0.05 and 1 g/m$^2$.

7. The method according to claim 1, wherein the polymer film is a thermoplastic polymer film selected from the group consisting of PET, PAN, and PTFE, and having a thickness between 5 and 100 µm.

8. The method according to claim 1, wherein the vacuum deposit of the layer of tin or tin base alloy on the polymer film is carried out using PVD, and wherein the thickness of the vacuum deposited layer of tin or tin base alloy is between 0.01 and 1 µm.

9. The method according to claim 1, wherein the flux comprises an alcohol-rosin dispersion, phenolsulfonic acid or chlorhydric acid and is simultaneously injected on the tin or tin base alloy covering the thin metallic strip and on the tin or tin base alloy covering the polymer film.

10. A coated metallic strip for packaging made up of steel strip coated on at least one of its faces with a coating having, in order starting from the surface of the thin metallic strip, a layer of tin or tin base alloy, an intermediate metallic layer of aluminum or aluminum base alloy and a thermoplastic polymer film, and not having any trace of adhesive between the layer of tin or tin base alloy and the thermoplastic polymer film.

11. The method according to claim 1, wherein the at least one polymer film having a layer of tin or tin base alloy does not contain adhesive between the layer of tin or tin base alloy and the polymer film.

12. The method according to claim 2, wherein the thin steel strip is pickled and then said depositing a layer of tin or tin base alloy on at least one of the faces of the thin metallic strip is performed to form a tin or tin base alloy layer with a basis weight between 0.05 and 8 g/m$^2$.

13. The method according to claim 1, wherein said flux acts to eliminate tin oxides on the surfaces covered with tin or tin base alloy.

14. The method according to claim 1, wherein tin or tin base alloy is deposited by bright dipping or tin plating and the basis weight of the tin layer on the steel strip after bright dipping or tin plating is between 0.1 and 0.2 g/m$^2$.

15. The method according to claim 1, wherein the polymer film is a thermoplastic polymer film selected from the group consisting of PET, PAN, and PTFE, and having a thickness between 10 and 20 µm.

16. The method according to claim 1, wherein the vacuum deposit of the layer of tin or tin base alloy on the polymer film is carried out using PVD, and wherein the thickness of the vacuum deposited layer of tin or tin base alloy is between 0.05 and 0.2 µm.

17. The method according to claim 1, comprising said intermediate metal layer.

18. A method for manufacturing a coated metallic strip for packaging comprising a thin metallic strip coated on two of its faces with a coating containing, in order starting from the surface of the thin metallic strip, a layer of tin or tin base alloy, optionally an intermediate metal layer, and an organic layer formed of a polymer film, comprising:

depositing a layer of tin or tin base alloy on two faces of the thin metallic strip;

vacuum-depositing a layer of tin or tin base alloy on one face of a first polymer film;

vacuum-depositing a layer of tin or tin base alloy on one face of a second polymer film;

bringing together the first second polymer film having a layer of tin or tin base alloy and the second polymer film having a layer tin or tin base alloy with the thin metallic strip therebetween, such that the tin or tin base alloy face of the first polymer film having a layer of tin or tin base alloy and the tin or tin base alloy face of the second polymer film having a layer of tin or tin base alloy face the thin metallic strip, and injecting a flux between the faces brought together to clean the surfaces covered with tin or tin base alloy; and heating the layers of tin or tin base alloy to weld the first polymer film and the second polymer film to the thin metallic strip.

* * * * *